US008040182B2

(12) United States Patent
Horiguchi et al.

(10) Patent No.: US 8,040,182 B2
(45) Date of Patent: Oct. 18, 2011

(54) PREDISTORTER

(75) Inventors: Kenichi Horiguchi, Tokyo (JP); Naoko Matsunaga, Tokyo (JP); Ryoji Hayashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/746,363

(22) PCT Filed: Dec. 17, 2008

(86) PCT No.: PCT/JP2008/072964
§ 371 (c)(1),
(2), (4) Date: Jun. 4, 2010

(87) PCT Pub. No.: WO2009/090825
PCT Pub. Date: Jul. 23, 2009

(65) Prior Publication Data
US 2010/0277236 A1 Nov. 4, 2010

(30) Foreign Application Priority Data

Jan. 15, 2008 (JP) ................. 2008-005846

(51) Int. Cl.
H03F 1/26 (2006.01)
(52) U.S. Cl. ...................... 330/149; 375/297
(58) Field of Classification Search .................. 330/149, 330/129, 136; 375/297
See application file for complete search history.

(56) References Cited

U.S. PATENT DOCUMENTS

| 5,339,054 | A | 8/1994 | Taguchi | |
|---|---|---|---|---|
| 7,098,734 | B2 * | 8/2006 | Hongo et al. | 330/149 |
| 7,113,036 | B2 * | 9/2006 | Moffatt et al. | 330/149 |
| 7,288,988 | B2 * | 10/2007 | Braithwaite | 330/149 |
| 7,899,416 | B2 * | 3/2011 | McCallister et al. | 455/114.3 |
| 7,944,295 | B2 * | 5/2011 | Hongo et al. | 330/149 |
| 2003/0184372 | A1 | 10/2003 | Fudaba et al. | |
| 2004/0116083 | A1 | 6/2004 | Suzuki et al. | |
| 2004/0179629 | A1 | 9/2004 | Song et al. | |

(Continued)

FOREIGN PATENT DOCUMENTS

| JP | 6 21990 | 1/1994 |
|---|---|---|
| JP | 2003 298362 | 10/2003 |
| JP | 2004 289542 | 10/2004 |
| JP | 2004 320329 | 11/2004 |
| JP | 2005 333353 | 12/2005 |

(Continued)

OTHER PUBLICATIONS

Supplementary Search Report issued on Jan. 26, 2011, in European Patent Application No. 08870915.9-1233/2244380.

*Primary Examiner* — Henry Choe
(74) *Attorney, Agent, or Firm* — Oblon, Spivak, McClelland, Maier & Neustadt, L.L.P.

(57) ABSTRACT

Provided is a predistorter which compensates for a memory effect occurring in an amplifier used in a communication device, especially an electric memory effect as well. The predistorter includes: a distortion compensation circuit (8) for compensating for a nonlinear distortion caused by an amplifier (3), in which the distortion compensation circuit outputs a predistortion signal to be input to the amplifier. The predistorter includes: first filter section (21) which is connected between the distortion compensation circuit and the amplifier, for compensating for a frequency characteristic appearing in a signal component occurring in an entire analog circuit including the amplifier; and second filter section (22) which is connected between the distortion compensation circuit and the first filter section or between the first filter section and the amplifier, for compensating for a frequency characteristic appearing in a distortion component occurring in the amplifier.

15 Claims, 8 Drawing Sheets (a)

(b)

| U.S. PATENT DOCUMENTS | | | | FOREIGN PATENT DOCUMENTS | | |
|---|---|---|---|---|---|---|
| 2005/0157814 A1 | 7/2005 | Cova et al. | | | | |
| 2005/0258898 A1 | 11/2005 | Hongo | | JP | 2006 505160 | 2/2006 |
| 2006/0240786 A1 | 10/2006 | Liu | | JP | 2006 191673 | 7/2006 |
| 2008/0211576 A1* | 9/2008 | Moffatt et al. | 330/149 | * cited by examiner | | |

(a)

(b)

AMPLIFIER OUTPUT (a)

(b)

(c)

(a)

(b)

(a)

(b)

(c)

PREDISTORTER

TECHNICAL FIELD

The present invention relates to a predistorter for compensating for degradation elements such as a nonlinear distortion, a linear distortion (frequency characteristics appearing in a signal component), and a memory effect (frequency characteristics appearing in a distortion component) which occur in an amplifier used for communication.

BACKGROUND ART

Examples of a conventional device of such type include a modulated signal transmission system which compensates for a nonlinear distortion coexisting with a linear distortion in a power amplifier by using an adaptive linearizer (see, for example, Patent Document 1 described below).
Patent Document 1: JP 06-21990 A

DISCLOSURE OF THE INVENTION

Problem to be Solved by the Invention

As a distortion occurring in an amplifier used in a communication device, there is a memory effect in addition to a nonlinear distortion and a linear distortion, and it is also desired to compensate for the memory effect.

It is an object of the present invention to provide a predistorter which compensates for the memory effect occurring in the amplifier used in the communication device, especially an electric memory effect as well.

Means for Solving the Problem

A predistorter according to the present invention includes a distortion compensation circuit for compensating for a nonlinear distortion caused by an amplifier, in which the distortion compensation circuit outputs a predistortion signal to be input to the amplifier. The predistorter includes: first filter means which is connected between the distortion compensation circuit and the amplifier, for compensating for a frequency characteristic appearing in a signal component occurring in an entire analog circuit including the amplifier; and second filter means which is connected between the distortion compensation circuit and the first filter means or between the first filter means and the amplifier, for compensating for a frequency characteristic appearing in a distortion component occurring in the amplifier.

Effects of the Invention

The present invention allows compensation of three degradation elements of the nonlinear distortion, the linear distortion, and the memory effect which occur in the amplifier by, for example, connecting a digital filter in a stage subsequent to the distortion compensation circuit for compensating for the nonlinear distortion, and calculating a coefficient of the digital filter so as to minimize an intermodulation distortion component output from the amplifier.

BEST MODE FOR CARRYING OUT THE INVENTION

Figure 1:
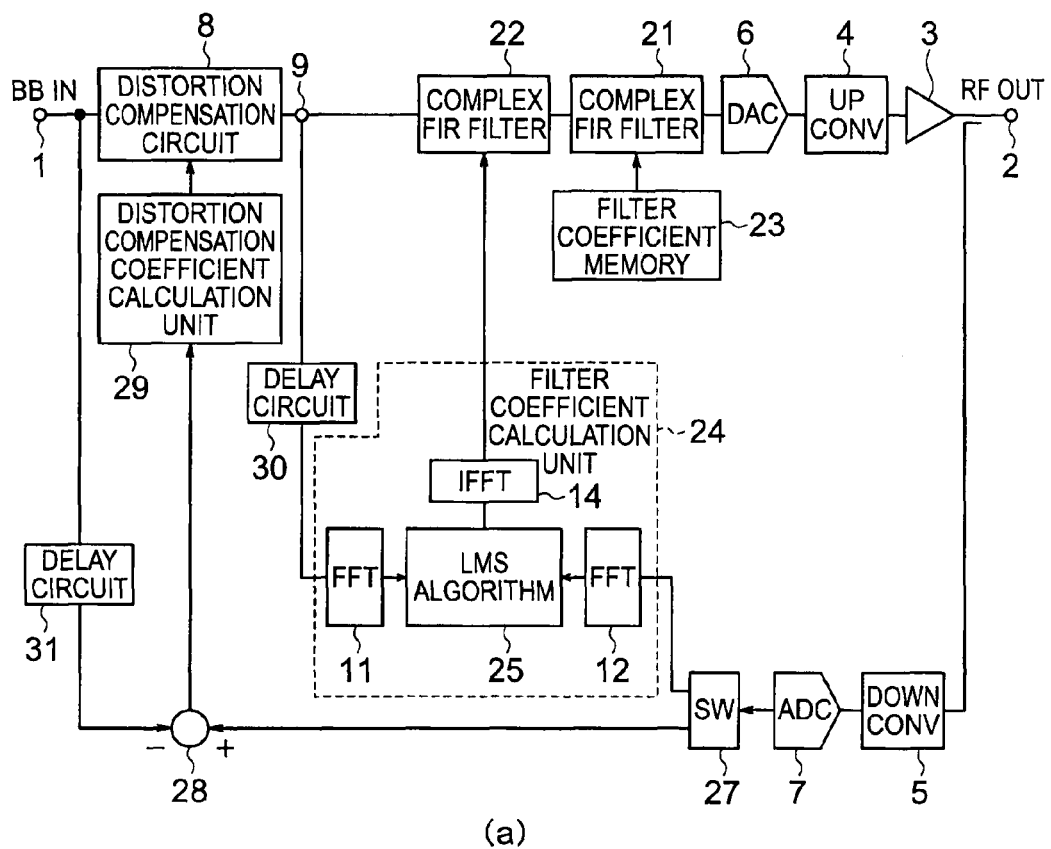
FIG. 1 is a diagram illustrating a structure of a digital predistorter according to Embodiment 1 of the present invention.
Figure 1:
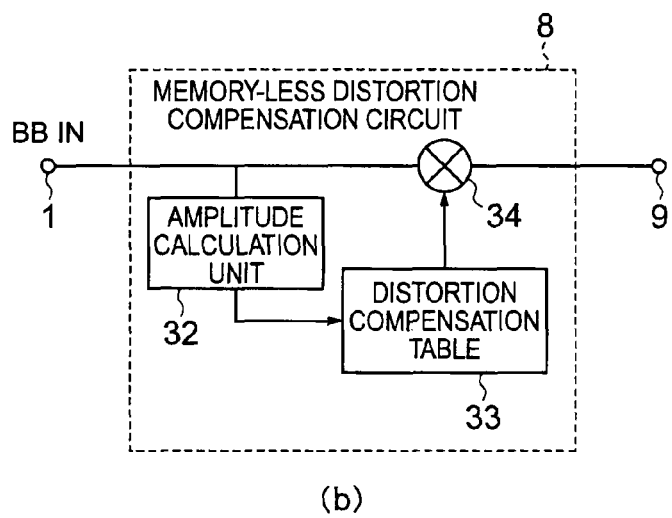

Before describing a digital predistorter according to the present invention, a description is given of a problem of distortions occurring in an amplifier of a communication device.

In the amplifier used for satellite communication, ground microwave communication, mobile communication, or broadcasting, it is desired to linearly amplify a radio frequency (RF) signal with high efficiency. However, in general, an increase in efficiency is not compatible with an increase in linearity in the amplifier. In addition, with an increase in communication capacity in recent years, a signal bandwidth is increased and wide-band characteristics are required of the amplifier.

As a distortion compensation method capable of achieving relatively high efficiency, there is known a predistortion method. The predistortion method is a method in which the overall result obtained when a predistortion circuit (predistorter) is combined with the amplifier becomes linear by preliminarily adding characteristics inverse to a nonlinear distortion occurring in the amplifier to an input signal. The predistortion method includes an analog predistortion method which implements the predistortion circuit using an analog circuit, and a digital predistortion method which implements the predistortion circuit using a digital circuit. The digital predistortion method is superior to the analog predistortion method in terms of linearity, but the digital predistortion method has a problem that the bandwidth of the signal which may be handled by the digital predistortion method is limited by operational speed of the digital circuit. However, against the backdrop that recent rapid advancement in the digital technologies has allowed a high-speed operation of the digital circuit to be achieved at a relatively low cost, the situation has started to change, and the digital distortion method is currently entering the phase of practical use.

Major degradation elements occurring in the amplifier in a transmission system include three elements of the nonlinear distortion, a linear distortion, and a memory effect. The nonlinear distortion refers to a waveform distortion caused by nonlinear characteristics of the circuit with respect to an input amplitude such as AM (amplitude modulation)-AM and AM-PM (phase modulation) characteristics, the linear distortion refers to the waveform distortion caused by linear frequency characteristics of the circuit (frequency characteristics appearing in a signal component), and the memory effect refers to the waveform distortion caused by a mutual relation between the nonlinear characteristics of the circuit and various frequency characteristics of the circuit (frequency characteristics appearing in a distortion component).

In a simple amplifier model using only the nonlinear distortion (AM-AM and AM-PM characteristics) which is often used conventionally, the output of the amplifier is uniquely determined by the current input. However, when the linear distortion or the memory effect is present, in terms of a time domain, the output of the amplifier is related not only to the current input but also to a previous input value to the amplifier. On the other hand, in terms of a frequency domain, lateral asymmetricity with a carrier wave frequency as its center is created in a frequency spectrum of the distortion occurring in the amplifier. As far as the output waveform is observed, the linear distortion and the memory effect exhibit extremely similar phenomena, but the linear distortion and the memory effect are clearly different from each other in terms of the presence and absence of an interaction with a nonlinear circuit. Specifically, the linear distortion is based on the assumption that the circuit is linear, and hence the concept of the interaction with the nonlinear distortion does not exist and the linear distortion is influenced only by the frequency characteristics of the circuit in a signal frequency band. On the other hand, the memory effect is based on the assumption that the circuit is nonlinear, and hence it is necessary to consider the effect of remixing of the output signal containing the nonlinear distortion component and the input signal, and thermal response characteristics of the circuit, and therefore the occurrence mechanism of the waveform distortion is essentially different. The linear distortion appears as the same frequency characteristics in signal and in distortion, but the memory effect generally appears as different frequency characteristics in signal and in distortion.

Figure 9:
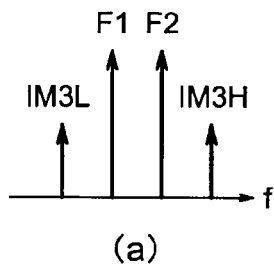
FIG. 9 is diagram illustrating output spectrums occurring in an amplifier.
Figure 9:
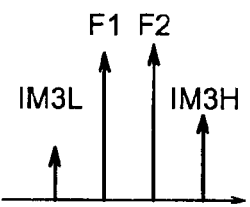
Figure 9:
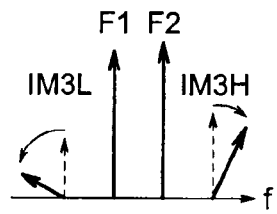

There are illustrated output spectrums from the amplifier during the input of two sine waves in the case where only the nonlinear distortion is present in (a) of FIG. 9, in the case where the linear distortion is present in (b) of FIG. 9, and in the case where both of the linear distortion and the memory effect are present in (c) of FIG. 9. For simplification, a description is given herein by assuming the case where only a gain component has frequency characteristics with a linear gradient in the linear distortion, and the case where only a phase component has curvilinear frequency characteristics in the memory effect. In the case where only the nonlinear distortion is present as illustrated in (a) of FIG. 9, the output spectrum of the amplifier exhibits a laterally symmetrical shape with the carrier wave frequency as the center, and amplitudes and phases of an upper side frequency IM3H and a lower side frequency IM3L of an intermodulation distortion (IM distortion) during the input of two sine waves become equal to each other. In contrast, in the case where the linear distortion is present as illustrated in (b) of FIG. 9, the upper side frequency IM3H and the lower side frequency IM3L are influenced in accordance with the gradient of the linear distortion so that a laterally asymmetrical output spectrum occurs. Further, in the case where both of the linear distortion and the memory effect are present as illustrated in (c) of FIG. 9, in addition, to the linear distortion, the frequency characteristics of the memory effect are additionally exerted so that the laterally asymmetrical output spectrum having a more complicated shape occurs.

Figure 10:
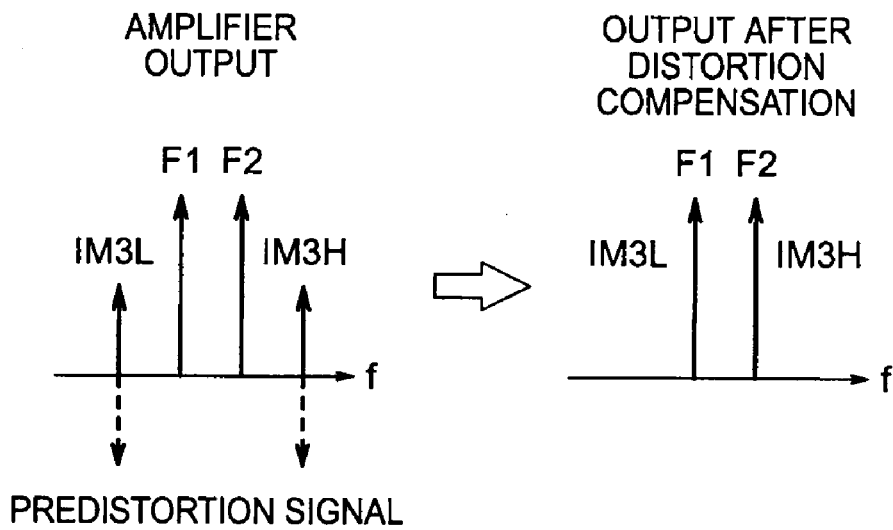
FIG. 10 is diagram illustrating relationships between the amplifier output and the predistortion signal in a predistorter which compensates for only a nonlinear distortion.
Figure 10:
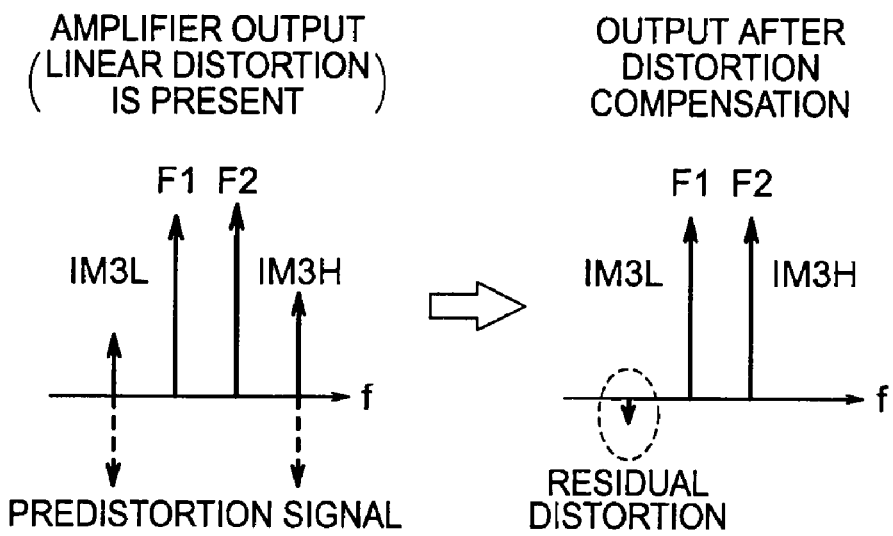

In the digital predistorter as the most basic predistorter which compensates for only the nonlinear distortion, by using a formula or a table having characteristics inverse to the preliminarily calculated nonlinear distortion of the amplifier, a complex gain coefficient in accordance with an instantaneous amplitude level of the input signal is calculated to generate a predistortion signal. FIG. 10 illustrates relationships between the amplifier output (solid line, the case where the distortion compensation is not performed) and the predistortion signal (broken line) by the digital predistorter which compensates for only the nonlinear distortion. The digital predistorter for compensating for only the nonlinear distortion may generate only the laterally symmetrical spectrum. Accordingly, the digital predistorter may perform the distortion compensation with respect to the amplifier having only the nonlinear distortion (laterally symmetrical output spectrum) as illustrated in (a) of FIG. 10, but the digital predistorter may not completely perform the distortion compensation with respect to the amplifier having at least one of the waveform distortion as illustrated in (b) of FIG. 10 and the memory effect (laterally asymmetrical output spectrum) due to the influence by the residual distortion.

Figure 11:
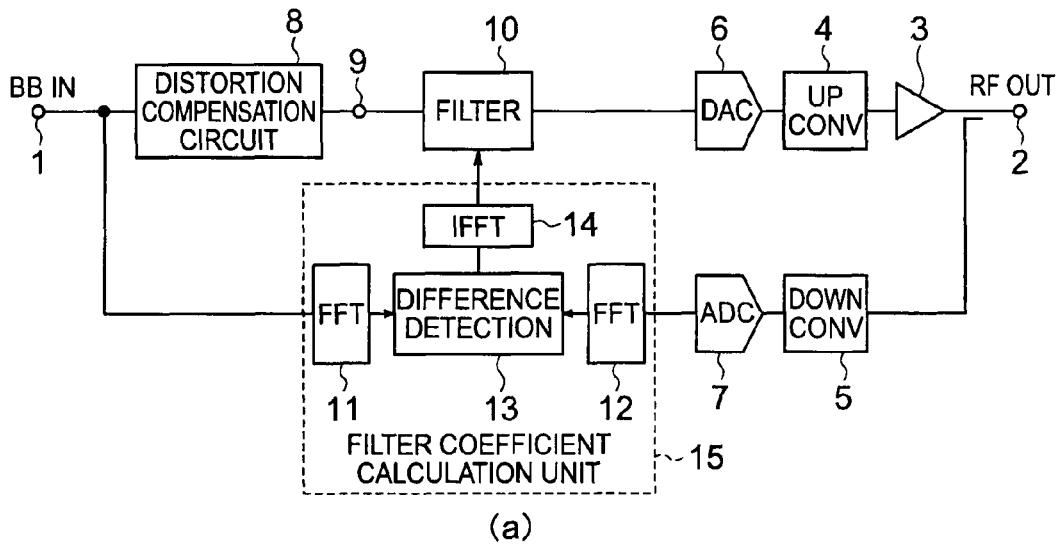
FIG. 11 is a structural diagram of a typical digital predistorter which performs compensation for a linear distortion in addition to the nonlinear distortion.
Figure 11:
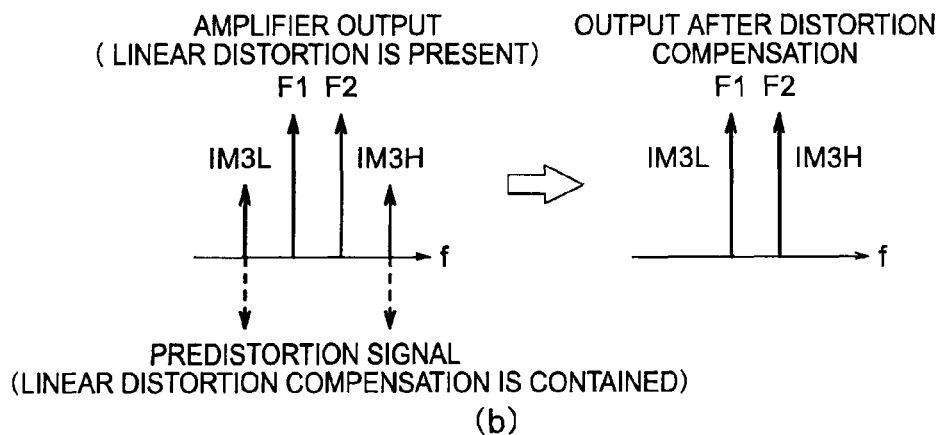
Figure 11:
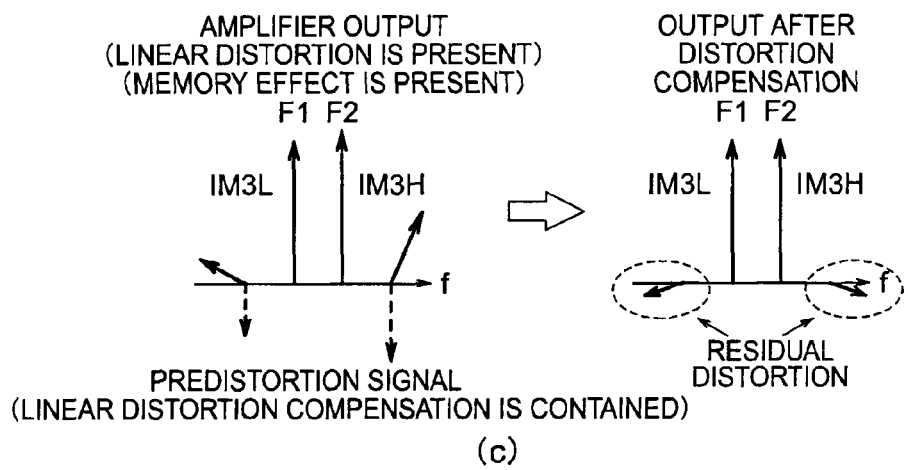

As one example of a digital predistorter obtained by conducting the study on this problem, (a) of FIG. 11 illustrates a structural diagram of the digital predistorter which performs the compensation for the linear distortion in addition to the nonlinear distortion. In (a) of FIG. 11, between an input terminal (BB IN) 1 for a base band signal and an output terminal (RF OUT) 2 for an RF signal, the digital predistorter includes an amplifier 3, a frequency conversion circuit (UP CONVERTER) 4 for converting the base band signal to the RF signal, a frequency conversion circuit (DOWN CONVERTER) 5 for converting the RF signal to the base band signal, a digital-analog conversion circuit (DAC) 6, an analog-digital conversion circuit (ADC) 7, a memory-less distortion compensation circuit 8, a filter 10, and a filter coefficient calculation unit 15 including fast Fourier transform circuits (FFTs) 11 and 12, a difference detection unit 13, and an inverse fast Fourier transform circuit (IFFT) 14. Reference numeral 9 denotes a memory-less predistortion signal output terminal. In addition, (b) of FIG. 11 illustrates the relationship between the amplifier output and the predistortion signal, and the amplifier output after the distortion compensation in the case where two degradations of the nonlinear distortion and the linear distortion are present in the amplifier. A (c) of FIG. 11 illustrates the relationship between the amplifier output and the predistortion signal, and the amplifier output after the distortion compensation in the case where both of the linear distortion and the memory effect are present.

In (a) of FIG. 11, such an inverse distortion signal as to cancel the nonlinear distortion occurring in the amplifier 3 is generated in the distortion compensation circuit 8 to compensate for the nonlinear distortion occurring in the amplifier 3. In addition, the filter 10 is provided in the digital circuit to perform the correction of the linear distortion occurring in the entire analog circuit including the amplifier 3 and the frequency conversion circuits 4 and 5 in addition to the nonlinear distortion occurring in the amplifier 3. Further, by using the output signal from the amplifier 3 and the base band input signal, estimation of the coefficient of the filter for compensating for the linear distortion is performed. This allows the distortion compensation in the case where two degradations of the nonlinear distortion and the linear distortion are present (see (b) of FIG. 11).

The predistorter of this type performs the compensation for the two degradation elements of the nonlinear distortion occurring in the amplifier and the linear distortion occurring in the entire analog circuit by combining the memory-less distortion compensation circuit 8 with the filter 10 for correcting the linear distortion. However, as another degradation occurring in the amplifier, the degradation caused by the memory effect exists.

The main occurrence mechanism of the memory effect is roughly divided into (1) temperature characteristics of a transistor, (2) a trap phenomenon of the transistor, and (3) a phenomenon in which an even-order distortion occurring in the transistor is influenced by out-of-band frequency characteristics of the circuit and is remixed with the input signal. Thus, the occurrence mechanism thereof is significantly different from that of the linear distortion caused by the frequency characteristics in the vicinity of a signal frequency. In particular, (3) is also called an electric memory effect, and the influence by the electric memory effect becomes more serious as the bandwidth of the signal handled in the system becomes wider.

The (c) of FIG. 11 illustrates the relationship between the amplifier output (in the case where the distortion compensation is not performed) and the predistortion signal in the case where both of the linear distortion and the memory effect are present in the amplifier. The predistorter described above is capable of compensating for the linear distortion, but the predistortion signal does not contain a component for compensating for the memory effect as the frequency characteristics of the distortion different from the frequency characteristics of the signal, and hence the residual distortion occurs. As a result, it is not possible to compensate for the memory effect.

The digital predistorter according to the present invention compensates for the memory effect occurring in the amplifier, especially the electric memory effect as well.

Embodiment 1

An (a) of FIG. 1 illustrates a structural diagram of a digital predistorter according to Embodiment 1 of the present invention. In (a) of FIG. 1, between the input terminal (BB IN) 1 for the base band signal and the output terminal (RF OUT) 2 for the RF signal, there are connected the memory-less distortion compensation circuit 8, the memory-less predistortion signal output terminal 9, finite impulse response filters (complex FIR filters) 21 and 22 having complex coefficients, the digital-analog conversion circuit (DAC) 6, the frequency conversion circuit (UP CONVERTER) 4 for converting the base band signal to the RF signal, and the amplifier 3. A delay circuit 31 is additionally connected to the input terminal (BB IN) 1, while the frequency conversion circuit (DOWN CONVERTER) 5 for converting the RF signal to the base band signal, the analog-digital conversion circuit (ADC) 7, and a switch (SW) 27 are connected in this order from the output terminal (RF OUT) 2 side, and an output of the delay circuit 31 and one output of the switch 27 are both connected to a comparison circuit 28. An output of the comparison circuit 28 is connected to the distortion compensation circuit 8 via a distortion compensation coefficient calculation unit 29.

A filter coefficient calculation unit 24 includes the fast Fourier transform circuit (FFT) 11 which receives an output of a delay circuit 30 connected to the memory-less predistortion signal output terminal 9, the fast Fourier transform circuit (FFT) 12 which receives the other output of the switch 27, a least mean square algorithm circuit (LMS algorithm) 25 which receives outputs of the fast Fourier transform circuits (FFTs) 11 and 12, and the inverse fast Fourier transform circuit (IFFT) 14 which receives an output of the least mean square algorithm circuit (LMS algorithm) 25. An output of the inverse fast Fourier transform circuit (IFFT) 14 is connected to the finite impulse response filter (complex FIR filter) 22. Further, a filter coefficient memory 23 is connected to the finite impulse response filter (complex FIR filter) 21.

Note that the parts which are the same as or corresponding to those of the digital predistorter described above are denoted by the same reference symbols.

In addition, in each of Embodiments described below, the portion from the input side of the digital-analog converter (DAC) 6 to the output side of the analog-digital converter (ADC) 7 corresponds to a digital circuit, while the portion from the output side of the digital-analog converter (DAC) 6 to the input side of the analog-digital converter (ADC) 7 corresponds to an analog circuit. The complex FIR filter 21 and the like constitute first filter means, the complex FIR filter 22 and the like constitute second filter means or filter means, and they are formed of digital filters. The filter coefficient calculation unit constitutes filter coefficient calculation means, and the distortion compensation coefficient calculation unit constitutes distortion compensation coefficient calculation means.

Next, operations are described. In the distortion compensation circuit 8, the base band signal input to the circuit from the input terminal 1 is added with such an inverse distortion signal as to cancel the nonlinear distortion occurring in the amplifier 3. After that, the base band signal is added with the frequency characteristics for compensating for the memory effect in the complex FIR filter 22, and is further added with the frequency characteristics for compensating for the linear distortion occurring in the entire analog circuit in the complex FIR filter 21. As a result, a predistortion signal for compensating for three degradation elements of the nonlinear distortion, the memory effect, and the linear distortion is generated. The predistortion signal generated in the digital circuit is converted to the analog signal by the digital-analog converter (DAC) 6, and the frequency thereof is converted to the RF frequency band by the frequency conversion circuit 4. After that, the signal is amplified by the amplifier 3 and is output.

In the distortion compensation circuit 8, by using the formula or the table having characteristics inverse to the nonlinear distortion in the amplifier 3, a complex gain coefficient in accordance with the instantaneous amplitude level of the input signal is calculated, and the predistortion signal is thereby generated. A (b) of FIG. 1 illustrates a structure of the distortion compensation circuit 8 using a lookup table. In a distortion compensation table 33, a value of the complex gain having the nonlinear characteristics inverse to those of the amplifier 3 in correspondence to the amplitude level of the signal is stored. In the distortion compensation circuit 8, in accordance with the amplitude level of the signal determined in an amplitude calculation unit 32, the value of the complex gain having the nonlinear characteristics inverse to those of the amplifier 3 is read from the distortion compensation table 33, and the predistortion signal is generated by performing a complex multiplication on the input signal in a multiplier 34. Data stored in the distortion compensation table 33 is determined in the distortion compensation coefficient calculation unit 29 by using an adaptive signal processing algorithm having such an operational paradigm as to minimize the difference between the base band input signal and the output signal from the amplifier 3. As the adaptive signal processing algorithm, for example, the least mean square algorithm (LMS algorithm) or a recursive least square algorithm (RLS algorithm) may be used.

The difference between the base band input signal input from the input terminal 1 via the delay circuit 31 and the output signal of the amplifier 3 input via the frequency conversion circuit 5, the analog-digital conversion circuit (ADC) 7, and the switch 27 is determined in the comparison circuit 28, and is supplied to the distortion compensation coefficient calculation unit 29.

The filter coefficient for correcting the linear distortion input to the complex FIR filter 21 may be determined by, for example, performing the inverse fast Fourier transform with respect to separately measured frequency characteristic data on the entire analog circuit including the frequency conversion circuit 4 and the amplifier 3. The filter coefficient is stored in the filter coefficient memory 23.

The coefficient to be given to the complex FIR filter 22 is determined in the filter coefficient calculation unit 24 by using an adaptive signal processing algorithm having such an operational paradigm as to minimize an intermodulation distortion component output from the amplifier 3 during the distortion compensation operation. As the adaptive signal processing algorithm, for example, the least mean square algorithm (LMS algorithm) or the recursive least square algorithm (RLS algorithm) may be used. The (a) of FIG. 1 illustrates an example of the structure when the LSM algorithm is used as the adaptive signal processing algorithm. In the filter coefficient calculation unit 24, the output signal of the distortion compensation circuit 8 and the output signal of the amplifier 3 are converted to frequency domain signals by the fast Fourier transform circuits 11 and 12, respectively, and the frequency domain signals are input to the LMS algorithm circuit 25 defined in the frequency domain. By setting such an operational paradigm as to minimize the intermodulation distortion component contained in the output signal of the amplifier 3 in the LMS algorithm circuit 25, there may be adaptively determined complex gain data having the frequency characteristics which minimize the memory effect. After that, by performing the inverse fast Fourier transform 14, a tap coefficient of the complex FIR filter 22 is produced. When the LMS algorithm is applied as assuming that the complex gain of the complex FIR filter is $W_n(\omega)$, the output signal of the distortion compensation circuit 8 is $V_{PD}(\omega)$, and the output signal from the amplifier 3 is $V_{FB}(\omega)$, the adaptive algorithm for compensating for the memory effect is given by the following expression:

$$W_{n+1}(\omega)=W_n(\omega)-\mu \cdot V_{PD}(\omega)^* \cdot V_{FB}(\omega) \quad (1)$$

where n represents the number of updates, $\omega$ represents an angular frequency, and $\mu$ represents a step size parameter.

In the filter coefficient calculation unit 24, the output signal of the distortion compensation circuit 8 is acquired via the memory-less predistortion signal output terminal 9 and the delay circuit 30, and the output signal of the amplifier 3 is acquired via the frequency conversion circuit 5, the analog-digital conversion circuit (ADC) 7, and the switch 27.

Figure 2:
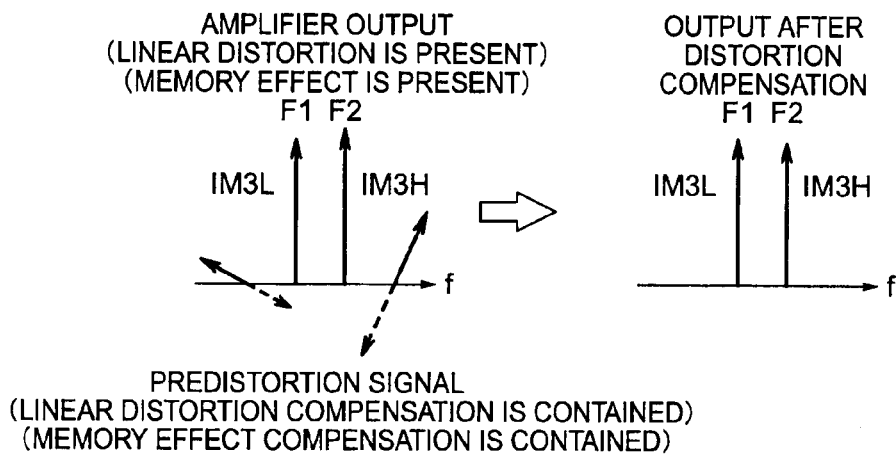
FIG. 2 is a diagram illustrating a relationship between an amplifier output and a predistortion signal according to Embodiment 1.

FIG. 2 illustrates a relationship between the amplifier output and the predistortion signal when an operation is conducted so that the intermodulation distortion component output from the amplifier 3 is minimized. In order to cancel the intermodulation distortion component output from the amplifier 3 after the distortion compensation operation, it is necessary to generate the predistortion signal in a laterally asymmetrical shape so as to have an inverse phase and an identical amplitude in correspondence to the laterally asymmetrical amplifier output spectrum. In this embodiment, the adaptive signal processing algorithm having such an operational paradigm as to minimize the intermodulation distortion component output from the amplifier 3 is adopted, and the coefficient of the complex FIR filter 22 is gradually corrected sequentially so that the predistortion signal coincides with the memory effect compensation signal Then, the filter coefficient value for generating the memory effect compensation signal is eventually derived.

Figure 3:
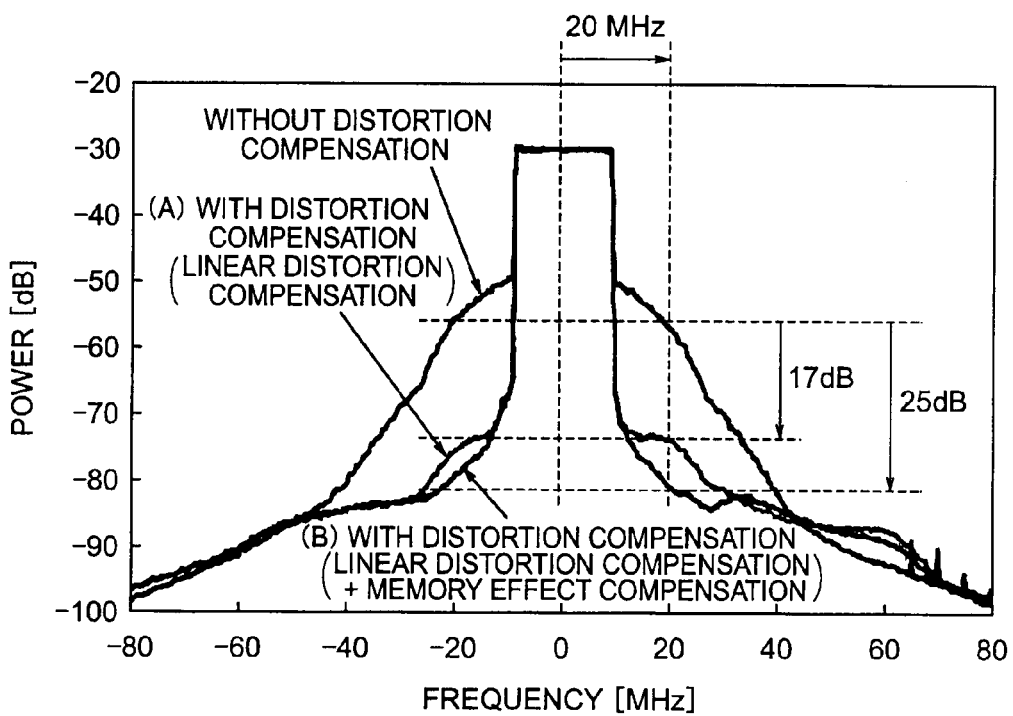
FIG. 3 is a diagram illustrating a result of an experiment of distortion compensation according to Embodiment 1.

FIG. 3 illustrates the result of a comparison experiment on results of the distortion compensation by the predistorter (A) having performed only the linear distortion compensation and the distortion compensation by the predistorter (B) having performed the memory effect compensation in addition to the linear distortion compensation. When attention is focused on the distortion level at detuning of 20 MHz, the amount of distortion cancellation is improved by 8 dB with the addition of the memory effect compensation (amount of distortion cancellation is 25 dB) as compared with the case where only the linear distortion compensation is performed (amount of distortion cancellation is 17 dB). It may be understood that the memory effect may not be completely cancelled and the residual distortion occurs when only the linear distortion compensation is performed, while distortion compensation characteristics are significantly improved with the addition of the memory effect compensation in addition to the linear distortion compensation.

Further, in this embodiment, for the purpose of avoiding incorrect convergence of the coefficients of the distortion compensation circuit 8 and the complex FIR filter 22, simultaneous operation of the adaptive algorithm for determining the coefficient of the distortion compensation circuit 8 and the adaptive signal processing algorithm for determining the coefficient of the complex FIR filter 22 may be prevented, which may be attained by switching a feedback signal at time intervals using the switch 27 to repeatedly perform their respective processings.

Figure 4:
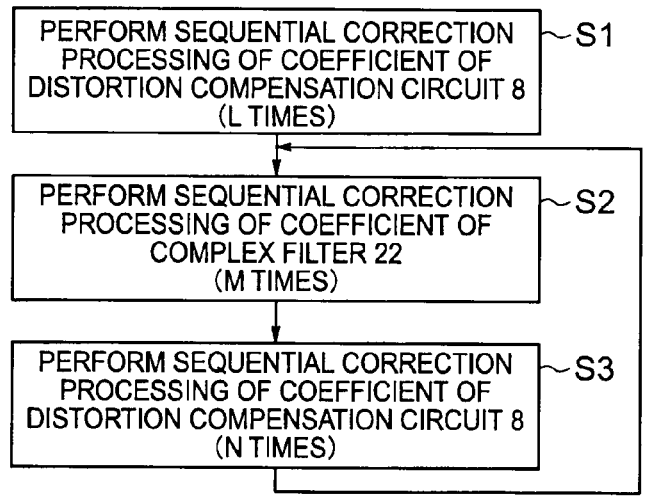
FIG. 4 is a flow chart illustrating a flow of processing by a distortion compensation circuit and a filter according to Embodiment 1.

FIG. 4 illustrates an operational flow of the adaptive signal processing algorithms. A repetitive processing is performed in which, after a sequential correction processing of the adaptive algorithm for determining the coefficient of the complex FIR filter 22 is performed M times (Step S2), the sequential correction processing of the adaptive algorithm for the memory-less distortion compensation circuit 8 is performed N times (Step S3), and the operational flow returns to the correction for the complex FIR filter 22 again. At the time of activation, the sequential correction processing of the adaptive algorithm for the distortion compensation circuit 8 is performed L times (L>N) which is larger than usual (Step S1).

With the operations described above, the coefficients for correcting the linear distortion and the memory effect are individually provided by the complex FIR filter 21 and the complex FIR filter 22, and the linear distortion and the memory effect are individually corrected by the individual filters, to thereby allow the predistorter to compensate for all of the three degradation elements of the nonlinear distortion, the memory effect, and the linear distortion.

In addition, the adaptive signal processing algorithms are used for the derivation of the coefficients of the memory-less distortion compensation circuit 8 and the complex FIR filter 22 so that constantly stable compensation operations of the nonlinear distortion and the memory effect may be realized irrespective of secular changes in the analog circuit such as the amplifier or the like.

Note that the complex FIR filter 22 of FIG. 1 may be disposed between the complex FIR filter 21 and the amplifier 3.

Embodiment 2

Figure 5:
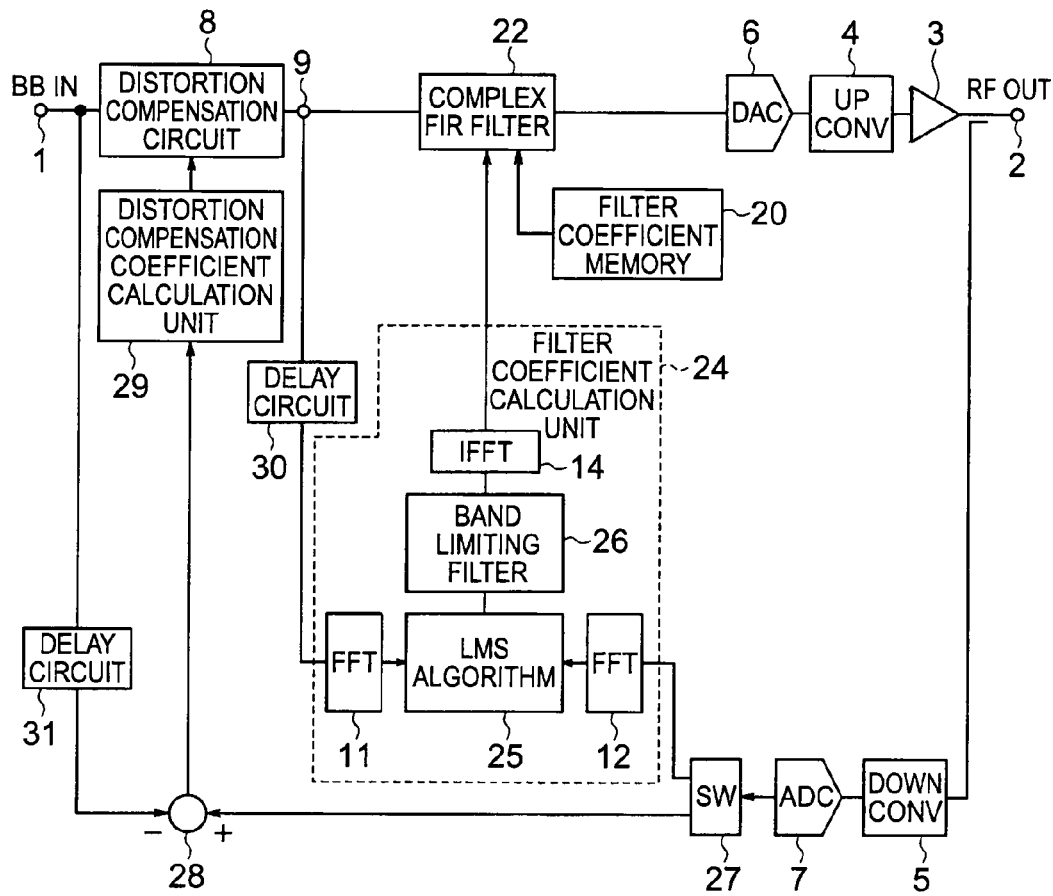
FIG. 5 is a diagram illustrating a structure of a digital predistorter according to Embodiment 2 of the present invention.

FIG. 5 illustrates a structural diagram of a digital predistorter according to Embodiment 2 of the present invention. The parts which are the same as or corresponding to those of the embodiment described above are denoted by the same reference symbols. In FIG. 5, the complex FIR filter 21 and the filter coefficient memory 23 are not provided, while a filter coefficient memory 20 is connected to the complex FIR filter 22 for compensating for the memory effect, and a band limiting filter 26 is further provided between the LMS algorithm circuit 25 and the inverse fast Fourier transform circuit 14 in the filter coefficient calculation unit 24.

In the filter coefficient calculation unit 24, the band limiting filter 26, which uses the inside of a signal band corresponding to its own channel as a stop band and uses an intermodulation distortion band outside the signal band as a pass band, is applied to the complex gain data, which is derived by the LMS algorithm circuit 25 and has the frequency characteristics which minimize the memory effect, and after that, the inverse fast Fourier transform 14 is performed, to thereby produce the coefficient of the complex FIR filter 22.

In addition, as an initial value of the LMS algorithm circuit 25, the filter coefficient for correcting the linear distortion occurring in the entire analog circuit is stored in the filter coefficient memory 20, and the filter coefficient is given to the complex FIR filter 22. This data may be determined by, for example, performing the inverse fast Fourier transform with respect to separately measured frequency characteristic data on the frequency conversion circuit 4 and the amplifier 3.

In this embodiment, the band limiting filter 26 is applied to the output result of the LMS algorithm circuit 25, to thereby retain the initial value for correcting the linear distortion without performing the update of the coefficient of the complex FIR filter 22 with regard to the inside of the signal band, while limiting the update of the coefficient of the complex FIR filter 22 to the band outside the signal band. By limiting the compensation performed by the complex FIR filter 22 to the memory effect occurring outside the signal band, only the memory effect occurring outside the signal band is compensated for without degrading the linear distortion within the signal band.

Further, by using the filter coefficient for correcting the linear distortion occurring in the entire analog circuit as the initial value of the LMS algorithm circuit 25, the incorrect convergence of the LMS algorithm circuit 25 may be avoided and the point which is optimum for both of the linear distortion and the memory effect may be derived. Other operations and effects are similar to those of Embodiment 1.

Embodiment 3

Figure 6:
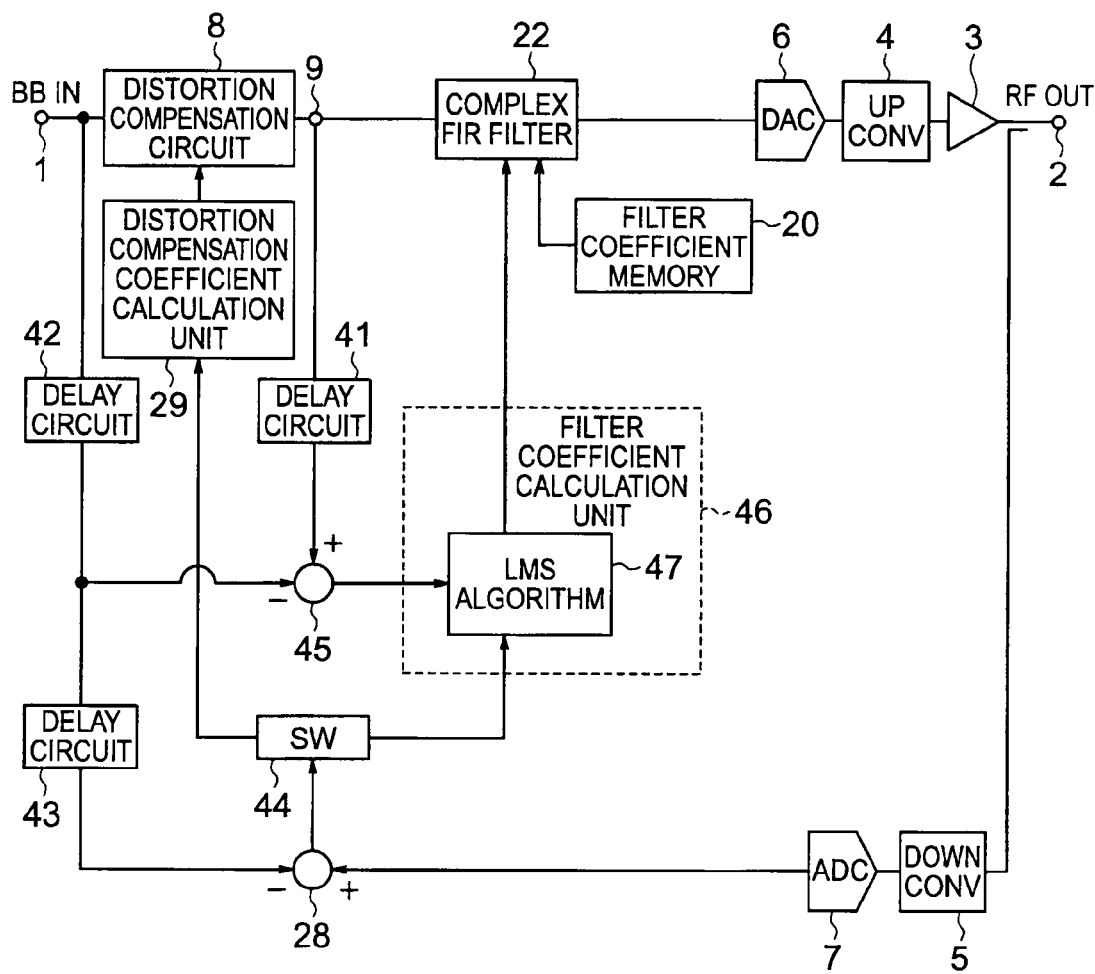
FIG. 6 is a diagram illustrating a structure of a digital predistorter according to Embodiment 3 of the present invention.

FIG. 6 illustrates a structural diagram of a digital predistorter according to Embodiment 3 of the present invention. The parts which are the same as or corresponding to those of the embodiments described above are denoted by the same reference symbols. In FIG. 6, between the input terminal (BB IN) 1 and the output terminal (RF OUT) 2, there are connected the memory-less distortion compensation circuit 8, the memory-less predistortion signal output terminal 9, the complex FIR filter 22, the digital-analog conversion circuit (DAC) 6, the frequency conversion circuit (UP CONVERTER) 4, and the amplifier 3. The filter coefficient memory 20 is connected to the complex FIR filter 22. Delay circuits 42 and 43 are additionally connected (connected in series) in this order from the input terminal (BB IN) 1, the frequency conversion circuit (DOWN CONVERTER) 5 and the analog-digital conversion circuit (ADC) 7 are connected in this order from the output terminal (RF OUT) 2 side, and the outputs of the delay circuit 43 and the analog-digital conversion circuit (ADC) 7 are both connected to the comparison circuit 28. The output of the comparison circuit 28 is selectively connected to the distortion compensation coefficient calculation unit 29 and a least mean square algorithm circuit (LMS algorithm) 47 of a filter coefficient calculation unit 46 via a switch (SW) 44. The output of the distortion compensation coefficient calculation unit 29 is connected to the memory-less distortion compensation circuit 8.

In addition, a delay circuit 41 is connected to the memory-less predistortion signal output terminal 9, the output of the delay circuit 41 and the output of the delay circuit 42 are input to a comparison circuit 45, the output of the comparison circuit 45 is connected to the LMS algorithm circuit 47 of the filter coefficient calculation unit 46, and the output of the LMS algorithm circuit 47 is connected to the complex FIR filter 22.

The coefficient to be given to the complex FIR filter 22 is determined by using an adaptive signal processing algorithm having such an operational paradigm as to minimize an intermodulation distortion component output from the amplifier 3 during the distortion compensation operation, in the filter coefficient calculation unit 46. As the adaptive signal processing algorithm, for example, the least mean square algorithm (LMS algorithm) or the recursive least square algorithm (RLS algorithm) may be used. FIG. 6 illustrates an example of the structure when the LSM algorithm is used as the adaptive signal processing algorithm. A predistortion distortion signal defined by the difference between the output signal from the distortion compensation circuit 8 and the input signal to the distortion compensation circuit 8 is determined in the comparison circuit 45 (the output signals both delayed in the delay circuits 41 and 42 are compared with each other in the comparison circuit 45), and a feedback distortion signal defined by the difference between the output signal from the amplifier 3 and the input signal to the above-mentioned distortion compensation circuit 8 is determined in the comparison circuit 28 (the input signal to the distortion compensation circuit 8 is acquired via the delay circuits 42 and 43, the output signal from the amplifier 3 is acquired via the frequency conversion circuit 5 and the analog-digital conversion circuit (ADC) 7, and the input signal and the output signal are compared with each other in the comparison circuit 28). In the filter coefficient calculation unit 46, the predistortion distortion signal and the feedback distortion signal are input to the LMS algorithm circuit 47 defined in the time domain. By setting such an operational paradigm as to minimize the intermodulation distortion component contained in the output signal of the amplifier 3 in the LMS algorithm circuit 47, there may be adaptively determined a tap coefficient of the complex FIR filter 22 having the frequency characteristics which minimize the memory effect.

In this embodiment, by using two signals which are the predistortion distortion signal defined by the difference between the output signal from the distortion compensation circuit 8 and the input signal to the distortion compensation circuit 8, and the feedback distortion signal defined by the difference between the output signal from the amplifier 3 and the input signal to the above-mentioned distortion compensation circuit 8, estimation of the coefficient of the complex FIR filter 22 is performed using the LMS algorithm circuit 47 in a time domain. Accordingly, as compared with a conventional example, the fast Fourier transform circuit and the inverse fast Fourier transform circuit become unnecessary, and the size of the digital circuit may be reduced. Other operations and effects are similar to those of Embodiment 1.

Embodiment 4

Figure 7:
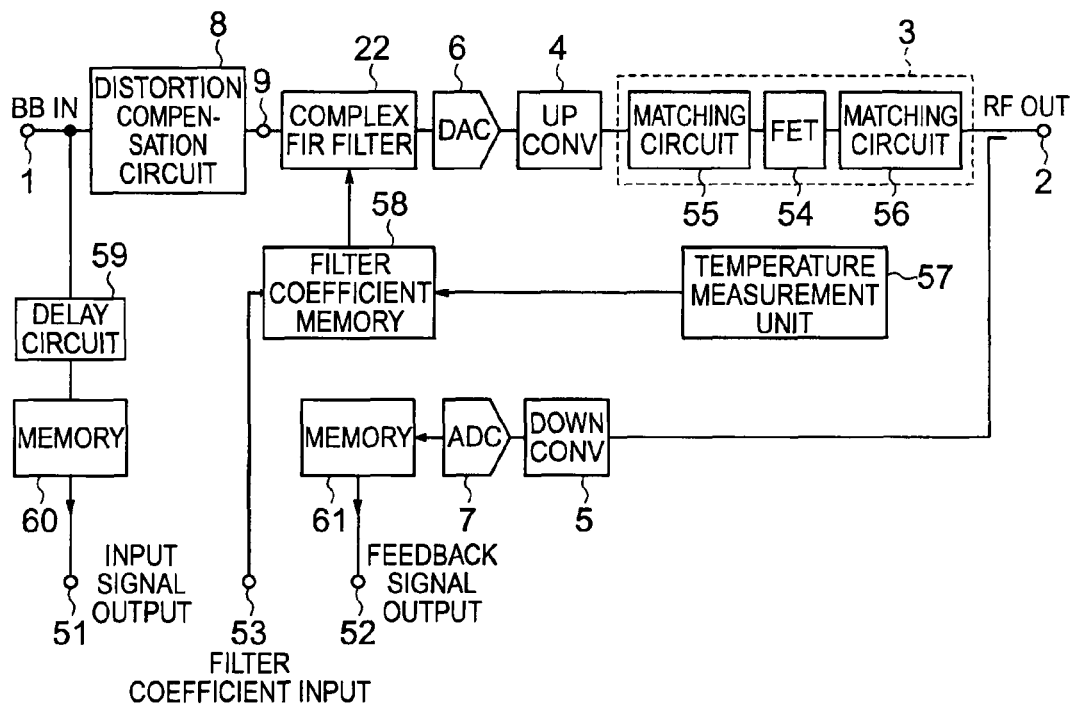
FIG. 7 is a diagram illustrating a structure of a digital predistorter according to Embodiment 4 of the present invention.

FIG. 7 illustrates a structural diagram of a digital predistorter according to Embodiment 4 of the present invention. The parts which are the same as or corresponding to those of the embodiments described above are denoted by the same reference symbols. In FIG. 7, between the input terminal (BB IN) 1 and the output terminal (RF OUT) 2, there are connected the memory-less distortion compensation circuit 8, the memory-less predistortion signal output terminal 9, the complex FIR filter 22, the digital-analog conversion circuit (DAC) 6, the frequency conversion circuit (UP CONVERTER) 4, and the amplifier 3 including a field-effect transistor (FET) 54, an input matching circuit 55, and an output matching circuit 56. A delay circuit 59 and a memory 60 are additionally connected (connected in series) in this order from the input terminal 1, and the memory 60 is connected to an input signal output terminal 51. In addition, the frequency conversion circuit (DOWN CONVERTER) 5, the analog-digital conversion circuit (ADC) 7, and a memory 61 are connected in this order from the output terminal 2 side, and a feedback signal output terminal 52 is connected to the memory 61. A filter coefficient input terminal 53 and a temperature measurement unit 57 are connected to a filter coefficient memory 58, and the filter coefficient memory 58 is connected to the complex FIR filter 22.

Next, operations are described. The base band signal input to the circuit from the input terminal 1 is added with such an inverse distortion signal as to cancel the nonlinear distortion occurring in the amplifier 3, in the distortion compensation circuit 8. After that, the base band signal is added with the frequency characteristics for correcting the memory effect in the complex FIR filter 22, and is further added with the frequency characteristics for correcting the linear distortion occurring in the entire analog circuit in the input matching circuit 55 or the output matching circuit 56 of the field-effect transistor (FET) 54 (the matching circuit has the frequency characteristics inverse to the frequency characteristics appearing in the signal component occurring in an entire transmitter (not shown) including the amplifier 3), to thereby generate the predistortion signal for correcting three degradation elements of the nonlinear distortion, the memory effect, and the linear distortion.

The predistortion signal generated in the digital circuit is converted to an analog signal by the digital-analog converter (DAC) 6, the frequency thereof is converted to the RF frequency band by the frequency conversion circuit 4, and the signal is then amplified by the amplifier 3 and is output.

In the distortion compensation circuit 8, by using a formula or a table having characteristics inverse to the nonlinear distortion of the amplifier, the complex gain coefficient according to the instantaneous amplitude level of the input signal is calculated, to thereby generate the predistortion signal. The (b) of FIG. 1 illustrates one example of the structure of the distortion compensation circuit 8 using a lookup table. In the distortion compensation table 33, a value of the complex gain having the nonlinear characteristics inverse to those of the amplifier 3 in correspondence to the amplitude level of the signal is stored. In the distortion compensation circuit 8, the value of the complex gain having the nonlinear characteristics inverse to those of the amplifier 3 is read from the distortion compensation table 33 in accordance with the amplitude level of the signal determined in the amplitude calculation unit 32, and the predistortion signal is generated by performing the complex multiplication on the input signal in the multiplier 34.

Figure 8:
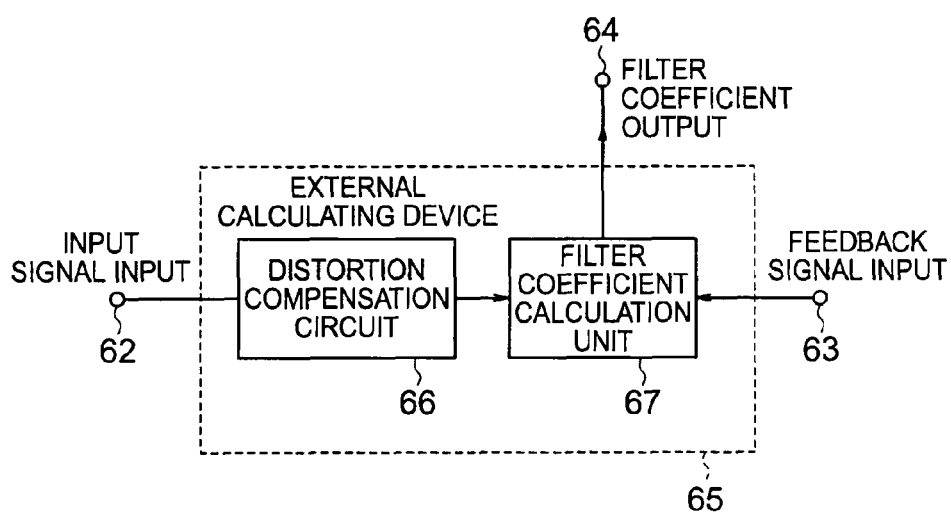
FIG. 8 is a diagram illustrating one example of a structure of an external calculating device according to Embodiment 4 of the present invention.

The coefficient given to the complex FIR filter 22 is calculated by using, for example, an external calculating device 65 outside the predistorter illustrated in FIG. 8. The external calculating device 65 may be a dedicated digital signal processing circuit or may be a personal computer for office use, and the calculating device may be in any form as long as the device is capable of calculation. In the external calculating device 65 of FIG. 8, an input signal input terminal 62 connected to the input signal output terminal 51 of FIG. 7 is connected to a distortion compensation circuit 66, the output of the distortion compensation circuit 66 and a feedback signal input terminal 63 connected to the feedback signal output terminal 52 of FIG. 7 are connected to a filter coefficient calculation unit 67, and the output of the filter coefficient calculation unit 67 is connected to a filter coefficient output terminal 64 connected to the filter coefficient input terminal 53 of FIG. 7. The input signal output terminal 51 and the feedback signal output terminal 52 serve as external output terminals of the predistorter, while the filter coefficient input terminal 53 serves as an external input terminal of the predistorter.

In the predistorter, for delivery to the external calculating device 65, an input signal to the distortion compensation circuit 8 and an output signal from the amplifier 3 during a given time period are stored in the memories 60 and 61, and are taken out from the input signal output terminal 51 and the feedback signal output terminal 52. The filter coefficient calculated in the external calculating device 65 is taken into the predistorter from the filter coefficient input terminal 53 via the filter coefficient output terminal 64, and is stored in the filter coefficient memory 58.

In this embodiment, in the filter coefficient memory 58 as filter coefficient change means, a different filter coefficient is stored for each of temperatures of the amplifier 3, and the coefficient is read from the filter coefficient memory 58 in accordance with the temperature of the amplifier 3 measured in the temperature measurement unit 57, and is input to the complex FIR filter 22.

With the operations described above, in this embodiment, the linear distortion and the memory effect are individually corrected by the matching circuits 55 and 56 of the transistor and the complex FIR filter 22, to thereby compensate for all of the three degradation elements of the nonlinear distortion, the memory effect, and the linear distortion in the predistorter.

Note that the delay circuit 59 and the memory 60 of FIG. 7 may be connected to the memory-less predistortion signal output terminal 9, to thereby output the output signal of the distortion compensation circuit 8 to outside from the output terminal 51.

In addition, the complex FIR filters 21 and 22 of FIGS. 1, 5, 6, and 7 formed of digital filters may be formed of nonlinear filters having different complex coefficients in accordance with the amplitudes of the input signals.

It should be appreciated that the present invention encompasses possible combinations of the embodiments described above.

INDUSTRIAL APPLICABILITY

The predistorter of the present invention may be used in many fields.

The invention claimed is:

1. A predistorter, comprising a distortion compensation circuit for compensating for a nonlinear distortion caused by an amplifier, wherein said distortion compensation circuit outputs a predistortion signal to be input to said amplifier, to thereby compensate for a memory effect occurring in said amplifier, the predistorter comprising:

first filter means connected between said distortion compensation circuit and said amplifier, for compensating for a frequency characteristic appearing in a signal component occurring in an entire analog circuit including said amplifier; and second filter means connected between said distortion compensation circuit and said first filter means or between said first filter means and said amplifier, for compensating for a frequency characteristic appearing in a distortion component occurring in the amplifier.

2. A predistorter, comprising a distortion compensation circuit for compensating for a nonlinear distortion caused by an amplifier, wherein said distortion compensation circuit outputs a predistortion signal to be input to said amplifier, to thereby compensate for a memory effect occurring in said amplifier, the predistorter comprising:

a matching circuit having a frequency characteristic inverse to a frequency characteristic appearing in a signal component occurring in an entire transmitter including said amplifier as a matching circuit of said amplifier; and filter means which is connected between said distortion compensation circuit and said amplifier, for compensating for a frequency characteristic appearing in a distortion component occurring in said amplifier.

3. A predistorter, comprising a distortion compensation circuit for compensating for a nonlinear distortion caused by an amplifier, wherein said distortion compensation circuit outputs a predistortion signal to be input to said amplifier, to thereby compensate for a memory effect occurring in said amplifier, the predistorter comprising:

a digital filter connected between said distortion compensation circuit and said amplifier; and filter coefficient calculation means for calculating and outputting a filter coefficient of said digital filter by using an output signal from said distortion compensation circuit and an output signal from said amplifier, wherein said filter coefficient calculation means performs calculation processing of the filter coefficient by using an adaptive signal processing algorithm which operates so as to minimize an intermodulation distortion output from said amplifier.

4. A predistorter, comprising a distortion compensation circuit for compensating for a nonlinear distortion caused by an amplifier, wherein said distortion compensation circuit outputs a predistortion signal to be input to said amplifier, to thereby compensate for a memory effect occurring in said amplifier, the predistorter comprising:

a digital filter connected between said distortion compensation circuit and said amplifier, and filter coefficient calculation means for determining a predistortion distortion signal defined by a difference between an output signal from said distortion compensation circuit and an input signal to said distortion compensation circuit and a feedback distortion signal defined by a difference between an output signal from said amplifier and an input signal to said distortion compensation circuit, to calculate and output a filter coefficient of the digital filter by using the predistortion distortion signal and the feedback distortion signal;

wherein said filter coefficient calculation means performs calculation processing of the filter coefficient by using an adaptive signal processing algorithm which operates so as to minimize an intermodulation distortion output from said amplifier.

5. A predistorter, comprising a distortion compensation circuit for compensating for a nonlinear distortion caused by an amplifier, wherein said distortion compensation circuit outputs a predistortion signal to be input to said amplifier, to thereby compensate for a memory effect occurring in said amplifier, the predistorter comprising:

a digital filter connected between said distortion compensation circuit and said amplifier; and filter coefficient calculation means for calculating and outputting a filter coefficient of said digital filter by using an output signal from said distortion compensation circuit which is converted to a frequency domain by being subjected to a Fourier transform, and an output signal from said amplifier which is converted to the frequency domain by being subjected to the Fourier transform, wherein said filter coefficient calculation means performs calculation processing of the filter coefficient by using an adaptive signal processing algorithm which operates so as to minimize power calculated in the frequency domain of an intermodulation distortion which is output from said amplifier.

6. The predistorter according to claim 3, wherein said digital filter comprises a finite impulse response filter having a complex coefficient.

7. The predistorter according to claim 3, wherein an initial value of the adaptive signal processing algorithm which performs the calculation of the filter coefficient of said digital filter is added with a characteristic inverse to a linear distortion of an analog circuit.

8. The predistorter according to claim 3, wherein said filter coefficient calculation means uses a least mean square algorithm as the adaptive signal processing algorithm in a frequency domain or a time domain.

9. The predistorter according to claim 3, wherein said distortion compensation circuit includes a table storing a nonlinear characteristic inverse to the nonlinear distortion caused by the amplifier, and generates the predistortion signal by reading a coefficient from the table in accordance with an amplitude level of an input signal to said distortion compensation circuit and performing a multiplication on the input signal.

10. The predistorter according to claim 5, wherein said filter coefficient calculation means includes a band limiting filter which uses an inside of a signal band corresponding to its own channel as a stop band, and uses an intermodulation distortion band outside the signal band as a pass band for a frequency characteristic estimated in the adaptive signal processing algorithm, and converts an output of said band limiting filter to a time domain to calculate a tap coefficient of said digital filter.

11. A predistorter, comprising a distortion compensation circuit for compensating for a nonlinear distortion caused by an amplifier, wherein said distortion compensation circuit outputs a predistortion signal to be input to said amplifier, to thereby compensate for a memory effect occurring in said amplifier, the predistorter comprising:

distortion compensation coefficient calculation means for performing calculation of a coefficient of said distortion compensation circuit by using a first adaptive signal processing algorithm which operates so as to minimize a difference between an input signal to said distortion compensation circuit and an output signal from said amplifier;

a digital filter connected between said distortion compensation circuit and said amplifier; and filter coefficient calculation means for calculating and outputting a filter coefficient of said digital filter by using an output signal from said distortion compensation circuit and the output signal from said amplifier, wherein said filter coefficient calculation means performs calculation processing of the filter coefficient by using a second adaptive signal processing algorithm which operates so as to minimize an intermodulation distortion output from said amplifier.

12. The predistorter according to claim 11, further comprising switch means for causing said distortion compensation coefficient calculation means and said filter coefficient calculation means to repeatedly and alternately perform the respective coefficient calculation processings each time the respective coefficient calculation processings are performed a predetermined number of times instead of simultaneously performing the respective coefficient calculation processings.

13. A predistorter, comprising a distortion compensation circuit for compensating for a nonlinear distortion caused by an amplifier, wherein said distortion compensation circuit outputs a predistortion signal to be input to said amplifier, to thereby compensate for a memory effect occurring in said amplifier, the predistorter comprising:

a digital filter which is connected between said distortion compensation circuit and said amplifier, for compensating for a frequency characteristic appearing in a distortion component occurring in said amplifier;

temperature measurement means for said amplifier; and filter coefficient change means for storing a plurality of coefficients of said digital filter, switching among the filter coefficients of said digital filter in accordance with a temperature of said amplifier, and inputting the filter coefficient after the switching to said digital filter.

14. A predistorter, comprising a distortion compensation circuit for compensating for a nonlinear distortion caused by an amplifier, wherein said distortion compensation circuit outputs a predistortion signal to be input to said amplifier, to thereby compensate for a memory effect occurring in said amplifier, the predistorter comprising:

a digital filter which is connected between said distortion compensation circuit and said amplifier, for compensating for a frequency characteristic appearing in a distortion component occurring in said amplifier;

an external input terminal for externally rewriting a filter coefficient of said digital filter;

a first memory storing at least one of an input signal to said distortion compensation circuit and an output signal from said distortion compensation circuit;

a first external output terminal for outputting data stored in said first memory;

a second memory storing the output signal from said amplifier; and a second external output terminal for outputting data stored in said second memory.

15. The predistorter according to claim 3, wherein said digital filter comprises a nonlinear filter having different complex coefficients in accordance with an amplitude of an input signal.

* * * * *